United States Patent
Suwada

(10) Patent No.: US 10,354,715 B2
(45) Date of Patent: Jul. 16, 2019

(54) SEMICONDUCTOR DEVICE AND CONTROL METHOD FOR SEMICONDUCTOR DEVICE

(71) Applicant: FUJITSU LIMITED, Kawasaki-shi, Kanagawa (JP)

(72) Inventor: Makoto Suwada, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/822,254

(22) Filed: Nov. 27, 2017

(65) Prior Publication Data

US 2018/0166124 A1     Jun. 14, 2018

(30) Foreign Application Priority Data

Dec. 14, 2016 (JP) ................. 2016-242188

(51) Int. Cl.
*G11C 5/02* (2006.01)
*G11C 11/406* (2006.01)
(Continued)

(52) U.S. Cl.
CPC .......... *G11C 11/40626* (2013.01); *G11C 5/04* (2013.01); *G11C 7/04* (2013.01); *G11C 11/40618* (2013.01); *H01L 25/0657* (2013.01); *G11C 8/12* (2013.01); *H01L 24/16* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); (Continued)

(58) Field of Classification Search
CPC ....... G11C 11/40626; G11C 5/04; G11C 7/04; G11C 8/12; G11C 11/40618; H01L 25/065; H01L 25/0657
USPC .......................................... 365/51
See application file for complete search history.

(56) References Cited

U.S. PATENT DOCUMENTS 8,559,258 B1 * 10/2013 Stephens, Jr. ..... G11C 11/40615
365/222
2012/0163413 A1    6/2012 Kim et al.
(Continued)

FOREIGN PATENT DOCUMENTS

JP     2012-142576    7/2012
JP     2016-48592     4/2016
WO    2013/080426    6/2013

*Primary Examiner* — Huan Hoang
(74) *Attorney, Agent, or Firm* — Fujitsu Patent Center

(57) ABSTRACT

A semiconductor device in which a plurality of chips each including a memory circuit is stacked, the semiconductor device includes a transmission path including a plurality of microbumps formed in the plurality of chips, measurement circuitry that detects a reflected waveform when a signal is transmitted in the transmission path and measures propagation delay time for a certain part on the transmission path from the reflected waveform that has been detected, determination circuitry that calculates temperature of each memory area that corresponds to the certain part from the propagation delay time that has been measured by the measurement circuitry, and control circuitry that sets a refresh interval of each memory area, based on the temperature of each memory area, which has been calculated by the determination circuitry, and executes a refresh operation of the memory circuit in each memory area at the refresh interval that has been set.

12 Claims, 18 Drawing Sheets

(51) Int. Cl.
    *H01L 25/065*    (2006.01)
    *G11C 5/04*    (2006.01)
    *G11C 7/04*    (2006.01)
    *H01L 23/00*    (2006.01)
    *G11C 8/12*    (2006.01)

(52) U.S. Cl.
    CPC ............... *H01L 2225/06582* (2013.01); *H01L 2225/06589* (2013.01); *H01L 2225/06596* (2013.01); *H01L 2924/1436* (2013.01)

(56) References Cited

U.S. PATENT DOCUMENTS

2014/0059325 A1     2/2014    Morimoto et al.
2016/0064063 A1     3/2016    Nomura et al.

\* cited by examiner

FIG. 8

| Tm (MEMORY AREA TEMPERATURE) [°C] | REFRESH INTERVAL [$\mu$S] |
|---|---|
| Ta $\leqq$ Tm < Tb | Ca |
| Tb $\leqq$ Tm < Tc | Cb |
| Tc $\leqq$ Tm < Td | Cc |

SEMICONDUCTOR DEVICE AND CONTROL METHOD FOR SEMICONDUCTOR DEVICE

CROSS-REFERENCE TO RELATED APPLICATION

This application is based upon and claims the benefit of priority of the prior Japanese Patent Application No. 2016-242188, filed on Dec. 14, 2016, the entire contents of which are incorporated herein by reference.

FIELD

The embodiments discussed herein are related to a semiconductor device and a control method for a semiconductor device.

BACKGROUND

A stacked memory device in which a plurality of memory chips each including a dynamic random access memory (DRAM) circuit is stacked by coupling the memory chips via through silicon via (TSV) repeatedly performs a refresh operation at regular time intervals such that stored contents (data) are not lost due to discharge from a storage element of the DRAM circuit. Because the higher temperature becomes, the higher a discharging rate of discharge of electric charges from the storage element of the DRAM circuit becomes, the stacked memory device sets a uniform shortest refresh interval for the entire device such that the refresh interval is suitable for a memory block having the highest temperature inside of the device and executes a refresh operation, but as the temperature increases, the refresh interval is reduced to increase execution frequency.

A technology in which, in a stacked memory device in which a plurality of memory chips is stacked by coupling the memory chips via TSV, a temperature sensor circuit is disposed in each memory chip to output temperature information of the memory chip to the outside of the device, a refresh interval is externally set for each memory chip, based on the temperature information, and a refresh operation is performed has been proposed.

In the stacked memory device, a temperature difference occurs inside of the device due to an influence, such as an operation state of an inner circuit, heat generation of an LSI disposed therearound, or the like, and, even in a part in which temperature is low and the refresh interval may be long, the shortest refresh interval is set, and thereby, the execution frequency of the refresh operation is increased, so that power consumption of the stacked memory device is increased.

The following is a reference document.
[Document 1] Japanese Laid-open Patent Publication No. 2012-142576.

SUMMARY

According to an aspect of the invention, a semiconductor device in which a plurality of chips each including a memory circuit is stacked, the semiconductor device includes a transmission path including a plurality of microbumps formed in the plurality of chips, measurement circuitry that detects a reflected waveform when a signal is transmitted in the transmission path and measures propagation delay time for a certain part on the transmission path from the reflected waveform that has been detected, determination circuitry that calculates temperature of each memory area that corresponds to the certain part from the propagation delay time that has been measured by the measurement circuitry, and control circuitry that sets a refresh interval of each memory area, based on the temperature of each memory area, which has been calculated by the determination circuitry, and executes a refresh operation of the memory circuit in each memory area at the refresh interval that has been set.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a table illustrating an example of a refresh condition table in the first embodiment;

DESCRIPTION OF EMBODIMENTS

Embodiments will be described with reference to the accompanying drawings.

Figure 1A:
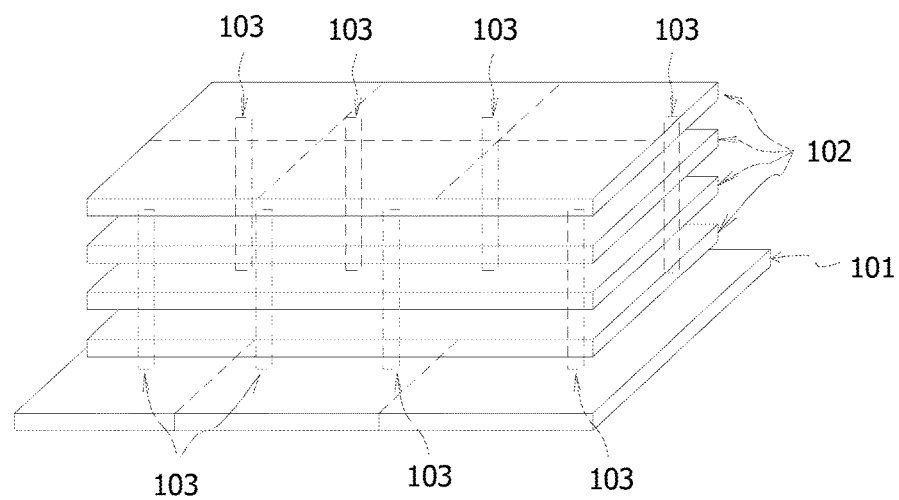
FIG. 1A and FIG. 1B are views illustrating a configuration example of a stacked memory device according to an embodiment.

FIG. 1A is a view illustrating a configuration example of a stacked memory device as a semiconductor device to which each of embodiments described below is applied. As illustrated in FIG. 1A, the stacked memory device includes a logic chip 101 including a logic circuit and a plurality of memory chips (DRAM chips) 102 each including a dynamic random access memory (DRAM) circuit as a memory circuit. The plurality of memory chips 102 is stacked on the logic chip 101 and is coupled to the logic chip 101 via through silicon via (TSV) 103.

Figure 1B:
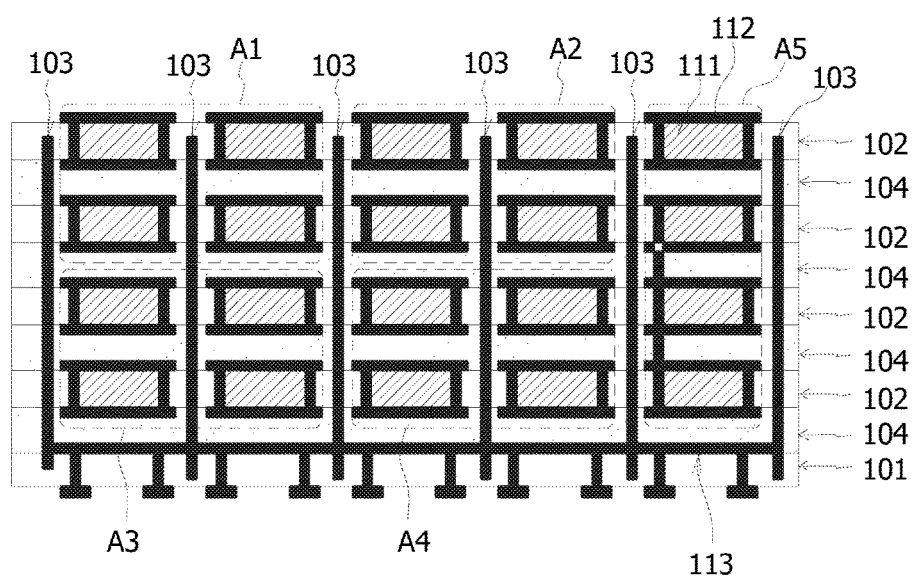

FIG. 1B is a cross-sectional view illustrating a configuration example of a stacked memory device. In FIG. 1B, a region including a part of the logic chip 101 and parts of the memory chips 102 of the stacked memory device (similar applies to configuration diagrams given below) is illustrated. In each of the memory chips 102, a memory cell including a storage element (a capacitive element) is formed in a memory cell region 111. Also, in the memory chip 102, an interconnect 112 for the memory cell is formed. In the logic chip 101, a circuit element 113, such as a logic element of a logic circuit, an interconnect, or the like, which realizes a certain function, is formed.

The logic chip 101 and the memory chips 102 are coupled to one another via the through silicon via (TSV) 103. An underfill 104 using a dielectric material is filled between the logic chip 101 and the memory chips 102. In order to facilitate observation of a reflected waveform in time domain reflectometry (TDR) measurement in each of embodiments described below, the underfill 104 is preferably an underfill (a high dielectric underfill) using a high dielectric material.

In a stacked memory device in each of embodiments described below, it is possible to independently set a time interval (a refresh interval) at which a refresh operation is performed for each of a plurality of divided memory areas (regions). In FIG. 1B, an example in which the region is divided into memory areas A1 to A5 is illustrated. In the stacked memory device in each of embodiments described below, the temperature of each memory area is calculated by analyzing a reflected waveform in TDR measurement and a refresh interval is set for each memory area, based on the calculated temperature. Note that, in the following description, data write control (write control) and data read control (read control) in the stacked memory device are similar to those in a known technology, and therefore, the description thereof will be omitted and refresh control will be described.

First Embodiment

A first embodiment will be described.

Figure 2:
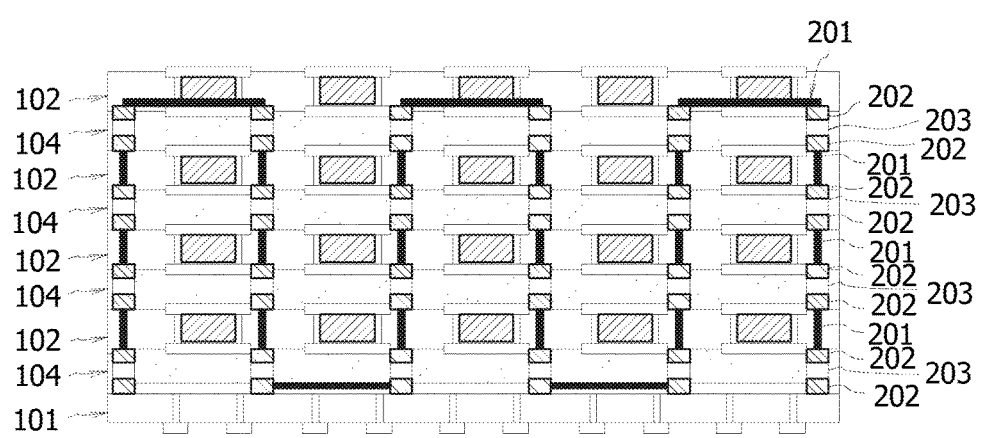
FIG. 2 is a view illustrating a configuration example of a stacked memory device in a first embodiment.

FIG. 2 is a cross-sectional view illustrating a configuration example of a stacked memory device in the first embodiment. As illustrated in FIG. 2, the stacked memory device in the first embodiment has the configuration illustrated in FIG. 1B and includes a transmission path that is used for TDR measurement for temperature measurement. The transmission path that is used for TDR measurement is formed of an interconnect 201, such as TSV, an intra-chip interconnect, or the like, and a microbump unit including a microbump 202 and a solder 203 that joins the microbumps 202 together.

Figure 3:
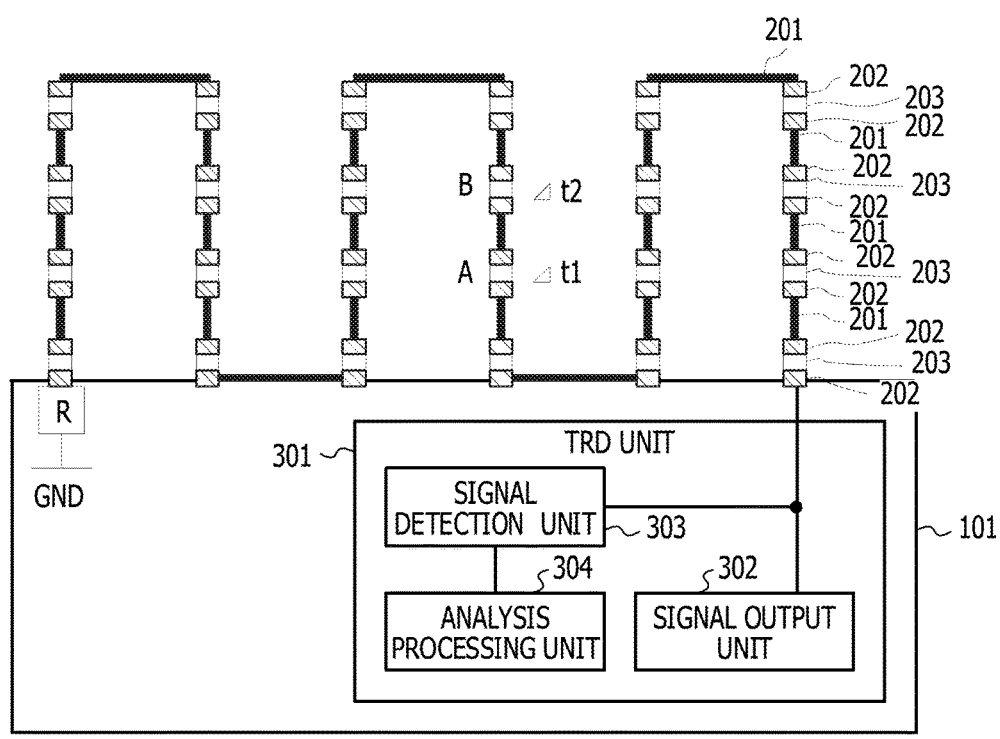
FIG. 3 is a diagram illustrating a configuration example of a stacked memory device in the first embodiment.

As illustrated in FIG. 3, one end of the transmission path that is used for TDR measurement is coupled to a TDR unit 301 in the logic chip 101. The other end of the transmission path that is used for TDR measurement is terminated by a terminal resistor. The TDR unit 301 is able to analyze the transmission path by TDR measurement in a time domain and includes a characteristic table that indicates a relationship between propagation delay time (or impedance) and temperature in the transmission path. The TDR unit 301 measures change in the propagation delay time or the impedance in the transmission path by applying a pulse signal or a step signal to the transmission path and observing a reflected waveform that returns.

The TDR unit 301 includes a signal output unit 302, a signal detection unit 303, and an analysis processing unit 304. The signal output unit 302 outputs a pulse signal or a step signal to the transmission path that is used for TDR measurement. The signal detection unit 303 detects a reflected wave that is generated in the transmission path when the signal that is output from the signal output unit 302 is transmitted therethrough and returns to the TDR unit 301. The analysis processing unit 304 analyzes a reflected waveform that has been detected by the signal detection unit 303 and calculates temperature, based on an analysis result and the characteristic table.

In the transmission path that is used for TDR measurement, the microbump unit (202, 203) is thicker than the interconnect 201 and the impedances of the interconnect 201 and the microbump unit (202, 203) are different from one another. Therefore, in the transmission path that is used for TDR measurement, the microbump unit (202, 203) serves as a reflecting point and a reflected wave returns to the TDR unit 301. Propagation delay time tpd in a reflected waveform is represented by, for example, tpd=3.34×√εr [ps/mm] (εr is relative permittivity). Thus, as the temperature increases, the impedance reduces and the propagation delay time in the reflected waveform increases.

Accordingly, the stacked memory device in the first embodiment measures the propagation delay time of the microbump unit (202, 203) and calculates temperature in vicinity of each memory cell located between the microbumps 202 from the propagation delay time that has been measured. Then, a refresh interval of each memory area is set, based on the temperature that has been calculated and a refresh operation is executed in accordance with the refresh interval that has been set. Note that, as described above, when a high dielectric material is used for the underfill 104, the impedance of the microbump unit (202, 203) is further reduced and the propagation delay time is further increased, so that observation of a reflected waveform is facilitated.

Figure 4:
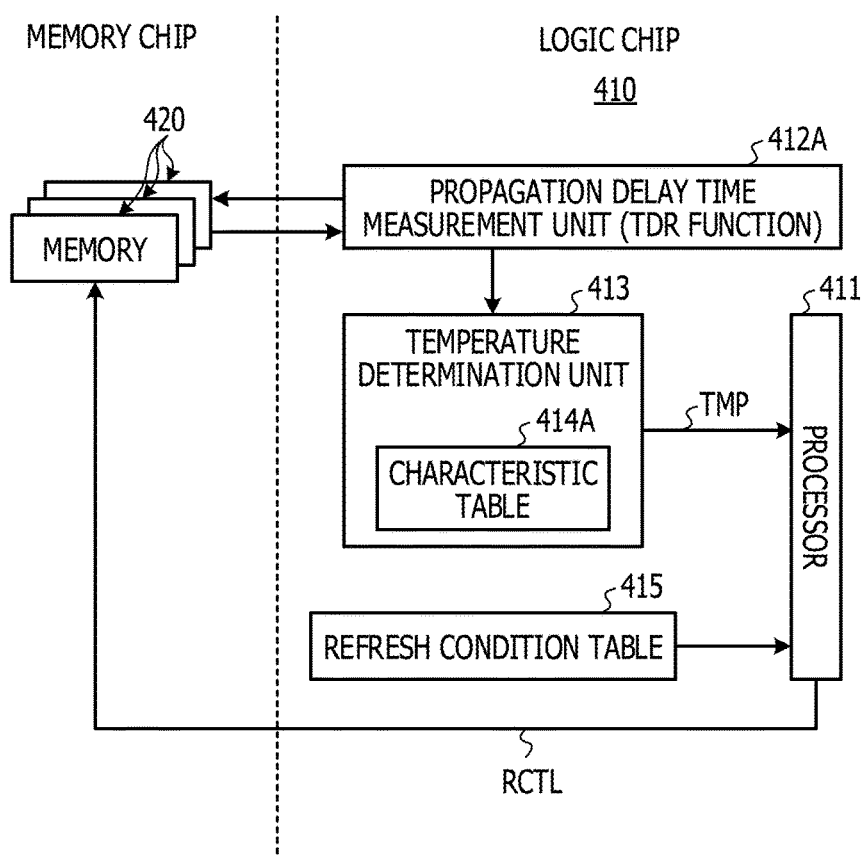
FIG. 4 is a diagram illustrating a functional configuration example for refresh control in a stacked memory device in the first embodiment.

FIG. 4 is a diagram illustrating a functional configuration example for refresh control in a stacked memory device in the first embodiment. In a logic chip 410, a processor 411 performs various types of control including refresh control for a memory chip 420, which are performed in the stacked memory device. A propagation delay time measurement unit 412A performs TDR measurement using a transmission path formed in the memory chip 420 and measures propagation delay time from a reflected waveform that has been observed. Functions of the propagation delay time measurement unit 412A are realized by the signal output unit 302, the signal detection unit 303, and the analysis processing unit 304 which are illustrated in FIG. 3.

A temperature determination unit 413 includes a propagation delay time-temperature characteristic table 414A that indicates a relationship between propagation delay time and temperature. The temperature determination unit 413 refers to the propagation delay time-temperature characteristic table 414A, calculates temperature TMP from propagation delay time that has been measured by the propagation delay time measurement unit 412A, and outputs the temperature TMP to the processor 411. A function of the temperature determination unit 413 is realized by the analysis processing unit 304 illustrated in FIG. 3.

When the processor 411 receives the temperature TMP that has been output from the temperature determination unit 413, the processor 411 refers to a refresh condition table 415 that indicates setting of a refresh interval relative to temperature and sets a refresh interval in accordance with the temperature TMP for each memory area. Also, the processor 411 controls a control signal RCTL or the like related to refresh for a memory in accordance with the refresh interval that has been set and instructs the memory to execute a refresh operation.

Figure 5:
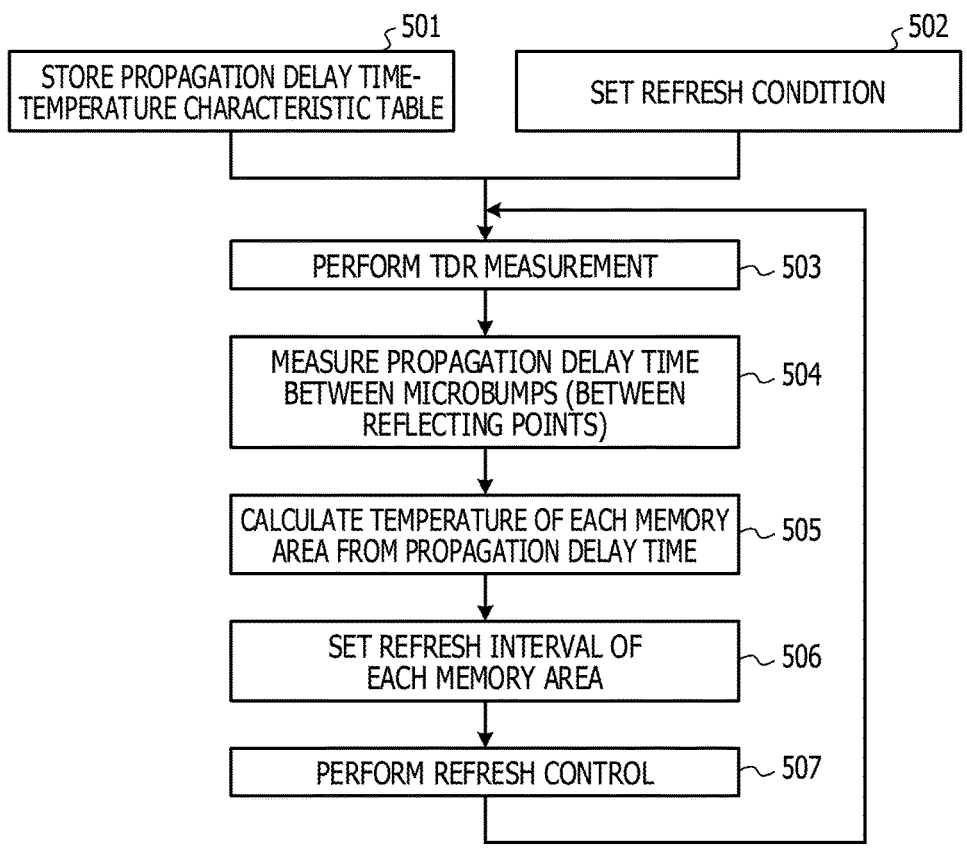
FIG. 5 is a chart illustrating an example of refresh control in a stacked memory device in the first embodiment.

FIG. 5 is a chart illustrating an example of refresh control in a stacked memory device in the first embodiment. In refresh control in the first embodiment, before refresh control is performed, the propagation delay time-temperature characteristic table 414A that indicates a relationship between propagation delay time of the microbump unit (202, 203) and temperature which have been obtained in advance is stored in the logic chip 410 (501). Also, a refresh condition that indicates a refresh interval relative to temperature is set in the refresh condition table 415 of the logic chip 410 (502).

Figure 6:
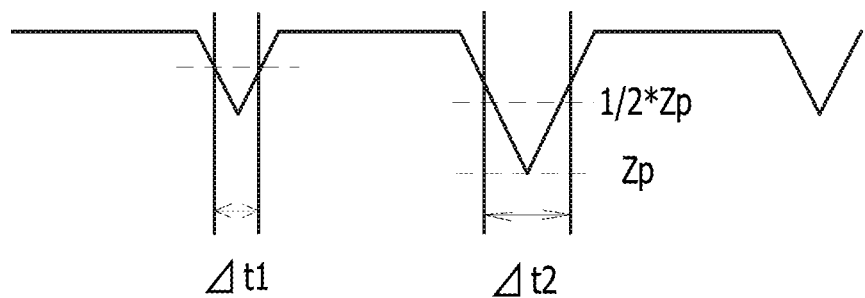
FIG. 6 is a chart illustrating an example of a reflected waveform in TDR measurement in the first embodiment.

When refresh control is started, the propagation delay time measurement unit 412A performs TDR measurement using a transmission path which is formed in the memory chip 420 and includes a plurality of microbump units (202, 203), and detects a reflected waveform (503). Subsequently, the propagation delay time measurement unit 412A performs analysis processing on the reflected waveform that has been detected and measures propagation delay time of each microbump unit (202, 203) (between reflecting points) (504). For example, it is assumed that a reflected waveform that indicates change in impedance, which is illustrated in FIG. 6, has been detected by reflection of the microbump units at a point A and a point B illustrated in FIG. 3. In this case, the propagation delay time measurement unit 412A measures, assuming that a time width with which a change amount of impedance is the half of a total change amount Zp, that is, ½×Zp, as the propagation delay time, Δt1 as the propagation delay time generated by the microbump unit at the point A and Δt2 as the propagation delay time generated by the microbump unit at the point B in an example illustrated in FIG. 6.

Figure 7:
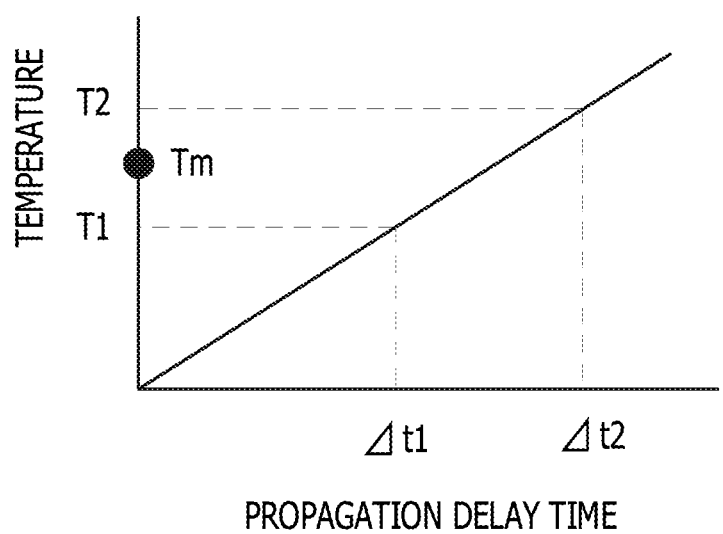
FIG. 7 is a graph illustrating an example of propagation delay time and temperature characteristics in the first embodiment.

Next, the temperature determination unit 413 refers to the propagation delay time-temperature characteristic table 414A and calculates temperature of each memory area from the propagation delay time that has been measured in processing 504 (505). For example, it is assumed that the relationship between the propagation delay time and the temperature, which is indicated by the propagation delay time-temperature characteristic table 414A, indicates characteristics illustrated in FIG. 7. In this case, the temperature determination unit 413 determines that temperatures that correspond to the propagation delay times Δt1 and Δt2 are T1 and T2 and determines that temperature in vicinity of a memory cell located between the microbumps 202 at the point A and the point B illustrated in FIG. 3 is Tm (=(T1+T2)/2). Thus, the temperature determination unit 413 calculates temperature of each memory area from the propagation delay time that has been measured in the processing 504.

Next, the processor 411 refers to the refresh condition table 415 and sets a refresh interval of each memory area, based on the temperature of each memory area, which has been calculated in processing 505 (506). In FIG. 8, an example of the refresh condition table 415 is illustrated. In the example illustrated in FIG. 8, if the temperature is Ta ° C. or more and less than Tb ° C., the refresh interval is set to Ca µs. Also, if the temperature is Tb ° C. or more and less than Tc ° C., the refresh interval is set to Cb µs (for example, a cycle of ½ times of Ca), which is lower than Ca, and, if the temperature is Tc ° C. or more and less than Td ° C., the refresh interval is set to Cc µs (for example, a cycle of ½ times of Cb), which is lower than Cb.

When the refresh interval of each memory area is set in processing 506, the processor 411 performs control of a refresh operation for a memory in accordance with the refresh interval that has been set (507). Thereafter, the stacked memory device regularly executes an operation of 503 to 507.

The stacked memory device in the first embodiment calculates the temperature of each memory area from the propagation delay time that has been obtained by TDR measurement using the transmission path formed in the memory chip 420 and sets the refresh interval of each memory area, based on the temperature that has been calculated. Thus, the memory areas are controlled such that a short refresh interval is set for a memory area in which temperature is high and a long refresh interval is set for a memory area in which temperature is low, and then, a refresh operation may be executed for each memory area. Therefore, in the stacked memory device in the first embodiment, optimization of refresh intervals may be achieved, a refresh operation may be executed for each memory area at proper refresh intervals in accordance with the temperature of the memory area, and power consumption may be reduced. Also, a wait time for waiting an access from a CPU may be reduced and performance may be increased, as compared to a case in which a uniform refresh interval is set for the entire memory, by executing a refresh operation for each memory area at proper refresh intervals in accordance with the temperature of the memory area.

Second Embodiment

Next, a second embodiment will be described. In a reflected waveform obtained by TDR measurement, a change amount of impedance also changes in accordance with temperature. In the second embodiment, change in impedance of the microbump unit (202, 203) is measured and temperature in vicinity of each memory cell located between the microbumps 202 is calculated from impedance that has been measured. Note that a configuration of a stacked memory device in the second embodiment is similar to the configuration of the staked memory device in the first embodiment, which is illustrated in FIG. 2 and FIG. 3, and therefore, the description thereof will be omitted.

Figure 9:
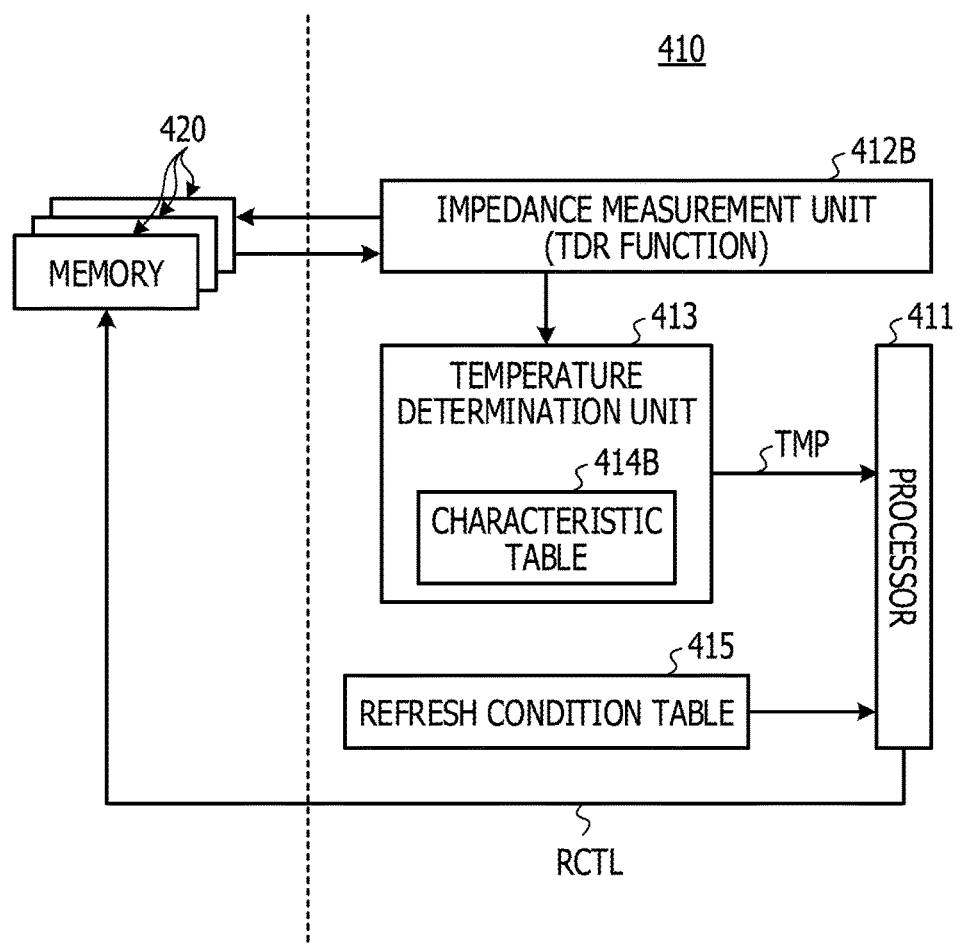
FIG. 9 is a diagram illustrating a functional configuration example for refresh control in a stacked memory device in a second embodiment.

FIG. 9 is a diagram illustrating a functional configuration example for refresh control in a stacked memory device in the second embodiment. In FIG. 9, components with functions substantially identical to those illustrated in FIG. 4 are identified by identical reference symbols to those in FIG. 4 and the description thereof will not be repeated. An impedance measurement unit 412B performs TDR measurement using a transmission path formed in the memory chip 420 and measures impedance from a reflected waveform that has been observed. Functions of the impedance measurement unit 412B are realized by the signal output unit 302, the signal detection unit 303, and the analysis processing unit 304.

The temperature determination unit 413 includes an impedance-temperature characteristic table 414B that indicates a relationship between impedance and temperature. The temperature determination unit 413 refers to the impedance-temperature characteristic table 414B, calculates temperature TMP from impedance that has been measured by the impedance measurement unit 412B, and outputs the temperature TMP to the processor 411. A function of the temperature determination unit 413 is realized by the analysis processing unit 304.

Figure 10:
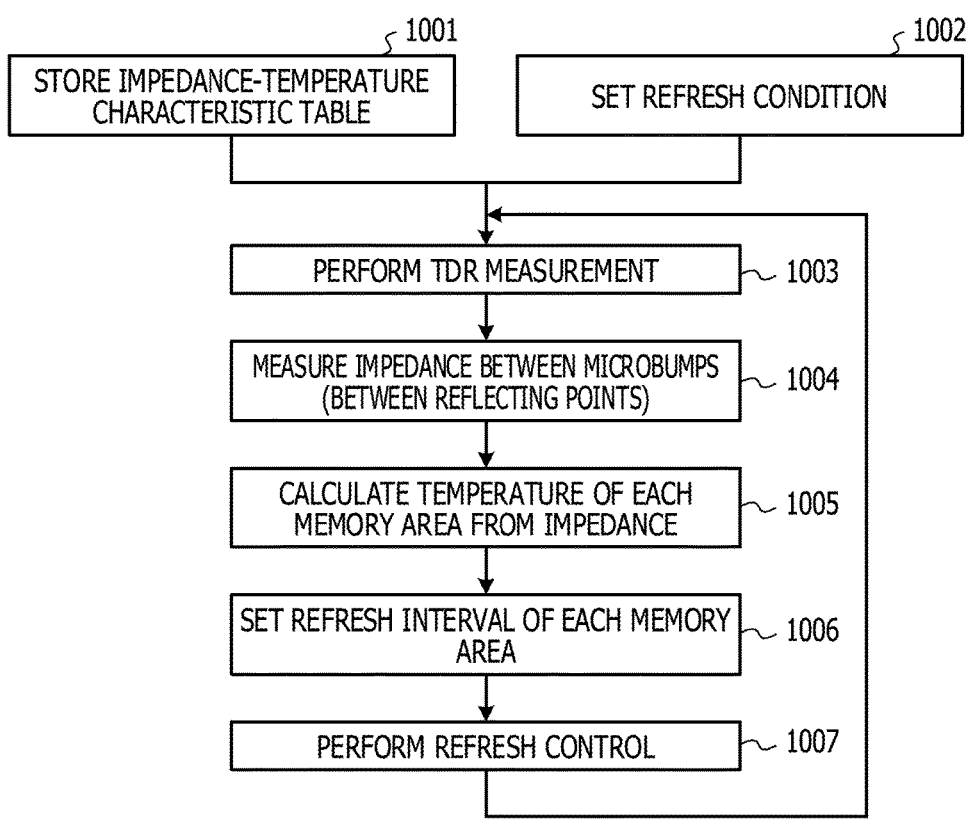
FIG. 10 is a chart illustrating an example of refresh control in a stacked memory device in the second embodiment.

FIG. 10 is a chart illustrating an example of refresh control in a stacked memory device in the second embodiment. In refresh control in the second embodiment, before refresh control is performed, the impedance-temperature characteristic table 414B that indicates a relationship between the impedance of the microbump unit (202, 203) and temperature which have been obtained in advance is stored in the logic chip 410 (1001). Also, a refresh condition that indicates a refresh interval relative to temperature is set in the refresh condition table 415 of the logic chip 410 (1002).

When refresh control is started, the impedance measurement unit 412B performs TDR measurement using a transmission path which is formed in the memory chip 420 and includes a plurality of microbump units (202, 203) and detects a reflected waveform (1003). Subsequently, the impedance measurement unit 412B performs analysis processing on the reflected waveform that has been detected and measures impedance of each microbump unit (202, 203) (between reflecting points) (1004). Next, the temperature determination unit 413 refers to the impedance-temperature characteristic table 414B and calculates temperature of each memory area from the impedance that has been measured in processing 1004 (1005).

Next, the processor 411 refers to the refresh condition table 415 and sets a refresh interval of each memory area, based on the temperature of each memory area, which has been calculated in processing 1005 (1006). When the refresh interval of each memory area is set in the processing 1006, the processor 411 performs control of a refresh operation for a memory in accordance with the refresh interval that has been set (1007). Thereafter, the staked memory device regularly executes an operation of 1003 to 1007.

As described above, the stacked memory device in the second embodiment calculates temperature of each memory area from impedance that has been obtained by TDR measurement using the transmission path formed in the memory chip 420 and sets a refresh interval of each memory area, based on the temperature that has been calculated. Thus, the memory areas are controlled such that a short refresh interval is set for a memory area in which temperature is high and a long refresh interval is set for a memory area in which temperature is low, and then, a refresh operation may be executed for each memory area. Therefore, in the stacked memory device in the second embodiment, optimization of refresh intervals may be achieved, a refresh operation may be executed for each memory area at proper refresh intervals in accordance with the temperature of the memory area, and power consumption may be reduced. Also, a wait time for waiting an access from a CPU may be reduced and performance may be increased, as compared to a case in which a uniform refresh interval is set for the entire memory, by executing a refresh operation for each memory area at proper refresh intervals in accordance with the temperature of the memory area.

Third Embodiment

Next, a third embodiment will be described.

When an LSI, such as a CPU or the like, is disposed in vicinity of a stacked memory device, the stacked memory device is influenced by heat generation of the LSI, so that, in the stacked memory device, temperature is high in a side close to the LSI and temperature is low in a side distant form the LSI. In the third embodiment, as illustrated in an example in FIG. 11, propagation delay time of a partial transmission path in a longitudinal direction (a stacking direction) which includes a plurality of microbump units (202, 203) and an interconnect (including TSV) 201 is measured by the TDR unit 301 and temperature of a memory area in the corresponding part is calculated from the propagation delay time that has been measured. That is, the propagation delay time between microbump units coupled in the longitudinal direction (the stacking direction) via the TSV 201 is measured. For example, in the transmission path formed in a memory chip for TDR measurement, propagation delay time between a lowermost microbump unit and an uppermost microbump unit that is disposed above the lowermost microbump unit is measured. Note that a configuration and a functional configuration of the stacked memory device in the third embodiment are similar to the configuration and the functional configuration of the stacked memory device in the first embodiment, which are illustrated in FIG. 2 to FIG. 4, and therefore, the description thereof will be omitted.

Figure 12:
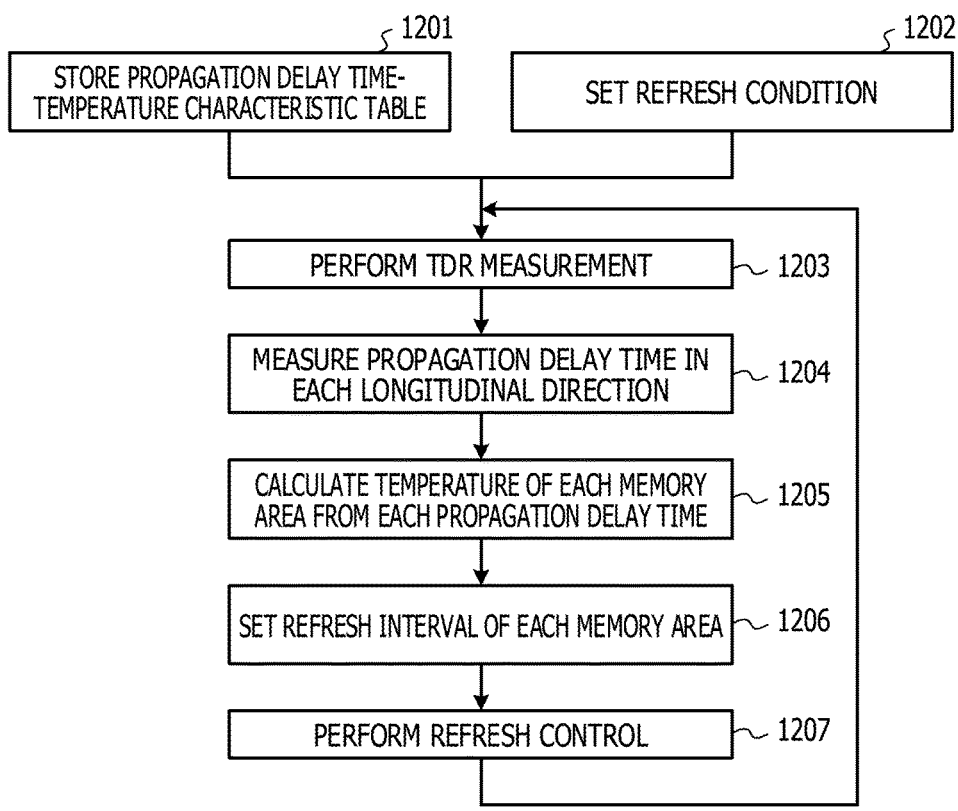
FIG. 12 is a chart illustrating an example of refresh control in a stacked memory device in the third embodiment.

FIG. 12 is a chart illustrating an example of refresh control in a stacked memory device in the third embodiment. In refresh control in the third embodiment, before refresh control is performed, the propagation delay time-temperature characteristic table 414A that indicates a relationship between propagation delay time of a partial transmission path in the longitudinal direction (the stacking direction) which includes the plurality of microbump units (202, 203) and the interconnect (including TSV) 201 and temperature which have been obtained in advance is stored in the logic chip 410 (1201). For example, in this example, the propagation delay time-temperature characteristic table 414A for a transmission path including three microbump units (202, 203) and three TSVs 201 is stored. Also, a refresh condition that indicates a refresh interval relative to temperature is set in the refresh condition table 415 of the logic chip 410 (1202).

Figure 13:
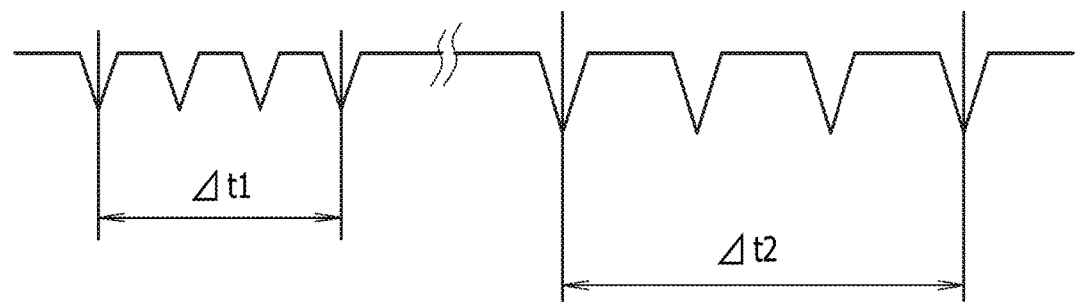
FIG. 13 is a chart illustrating an example of a reflected waveform in TDR measurement in the third embodiment.

When refresh control is started, the propagation delay time measurement unit 412A performs TDR measurement using a transmission path which is formed in the memory chip 420 and includes the plurality of microbump units (202, 203) and detects a reflected waveform (1203). Subsequently, the propagation delay time measurement unit 412A performs analysis processing on the reflected waveform that has been detected and measures propagation delay time of partial transmission path in each longitudinal direction (stacking direction) which includes the plurality of microbump units (202, 203) and the interconnect (including TSV) 201 (1204). For example, it is assumed that a reflected waveform that indicates change in impedance, which is illustrated in FIG. 13, has been detected. In this case, assuming that a period in which change in impedance has occurred due to reflection in the partial transmission path that is a measurement target is propagation delay time, the propagation delay time measurement unit 412A measures Δt1 and Δt2 as the propagation delay time of the partial transmission path in the longitudinal direction illustrated in FIG. 11.

Figure 11:
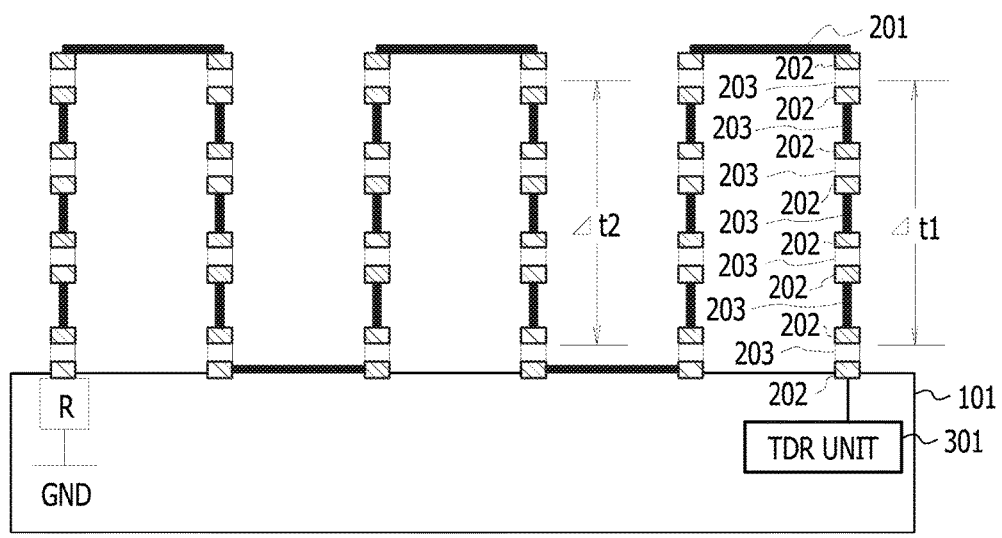
FIG. 11 is a view illustrating a configuration example of a stacked memory device in a third embodiment.
Figure 14:
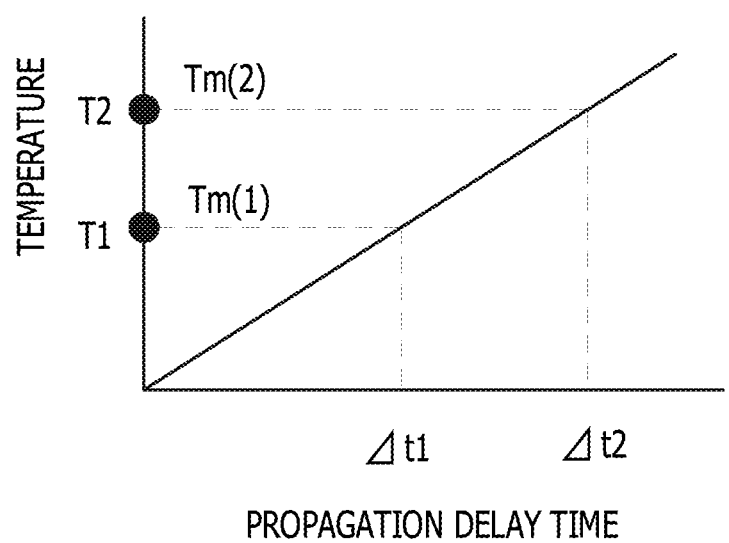
FIG. 14 is a graph illustrating an example of propagation delay time and temperature characteristics in the third embodiment.

Next, the temperature determination unit 413 refers to the propagation delay time-temperature characteristic table 414A and calculates temperature of each memory area from the propagation delay time that has been measured in processing 1204 (1205). For example, it is assumed that the relationship between the propagation delay time and the temperature which is indicated by the propagation delay time-temperature characteristic table 414A indicates characteristics illustrated in FIG. 14. In this case, the temperature determination unit 413 determines that temperatures Tm(1) and Tm(2) in vicinity of the partial transmission path in the longitudinal direction illustrated in FIG. 11 are temperatures T1 and T2 that correspond to the propagation delay times Δt1 and Δt2. Thus, the temperature determination unit 413 calculates the temperature of each memory area from the propagation delay time that has been measured in processing 1204.

Next, the processor 411 refers to the refresh condition table 415 and sets a refresh interval of each memory area, based on the temperature of each memory area, which has been calculated in processing 1205 (1206). Then, the processor 411 performs control of a refresh operation for a memory in accordance with the refresh interval that has been set (1207). Thereafter, the stacked memory device regularly executes an operation of 1203 to 1207.

The stacked memory device in the third embodiment calculates temperature of each memory area from the propagation delay time in the partial transmission path in the longitudinal direction, which has been obtained by TDR measurement using the transmission path formed in the memory chip 420, and sets a refresh interval of each memory area, based on the temperature that has been calculated. Thus, in the stacked memory device in the third embodiment, an influence of the heat generation of an LSI disposed in vicinity of the stacked memory device or the like is observed in a simple manner, so that optimization of refresh intervals may be achieved, a refresh operation may be executed for each memory area at proper refresh intervals in accordance with the temperature of the memory area, and power consumption may be reduced. Also, a wait time for waiting an access from a CPU may be reduced and performance may be increased, as compared to a case in which a uniform refresh interval is set for the entire memory, by executing a refresh operation for each memory area at proper refresh intervals in accordance with the temperature of the memory area.

Fourth Embodiment

Next, a fourth embodiment will be described.

Figure 15A:
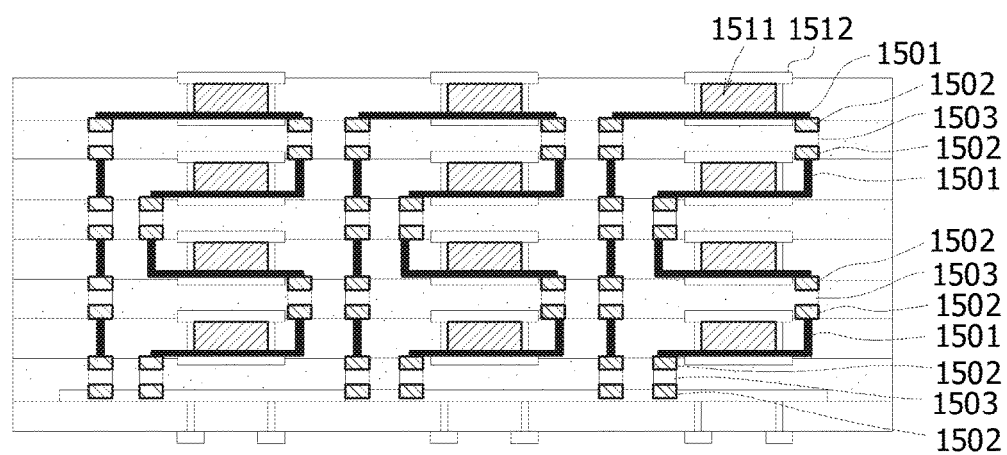
FIG. 15A and FIG. 15B are views illustrating a configuration example of a stacked memory device in a fourth embodiment.
Figure 15B:
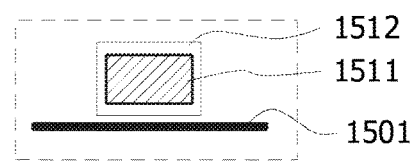

FIG. 15A is a cross-sectional view illustrating a configuration example of a stacked memory device in the fourth embodiment. As illustrated in FIG. 15A, the stacked memory device in the fourth embodiment has the configuration illustrated in FIG. 1B and includes a transmission path that is used for TDR measurement for temperature measurement. The transmission path that is used for TDR measurement is formed of an interconnect 1501, such as TSV, an intra-chip interconnect, or the like, and a microbump unit including a microbump 1502 and a solder 1503 that joins the microbumps 1502 together. In the stacked memory device in the fourth embodiment, a transmission path that is used for TDR measurement is formed such that the intra-chip interconnect is included between the microbump units (1502, 1503). As in a layout example viewed from top, which is illustrated in FIG. 15B, the intra-chip interconnect 1501 of the transmission path that is used for TDR measurement is disposed so as to be close to a memory cell area 1511 in which a memory cell is formed. In FIG. 15B, the reference numeral 1512 denotes an interconnect for the memory cell.

Figure 16:
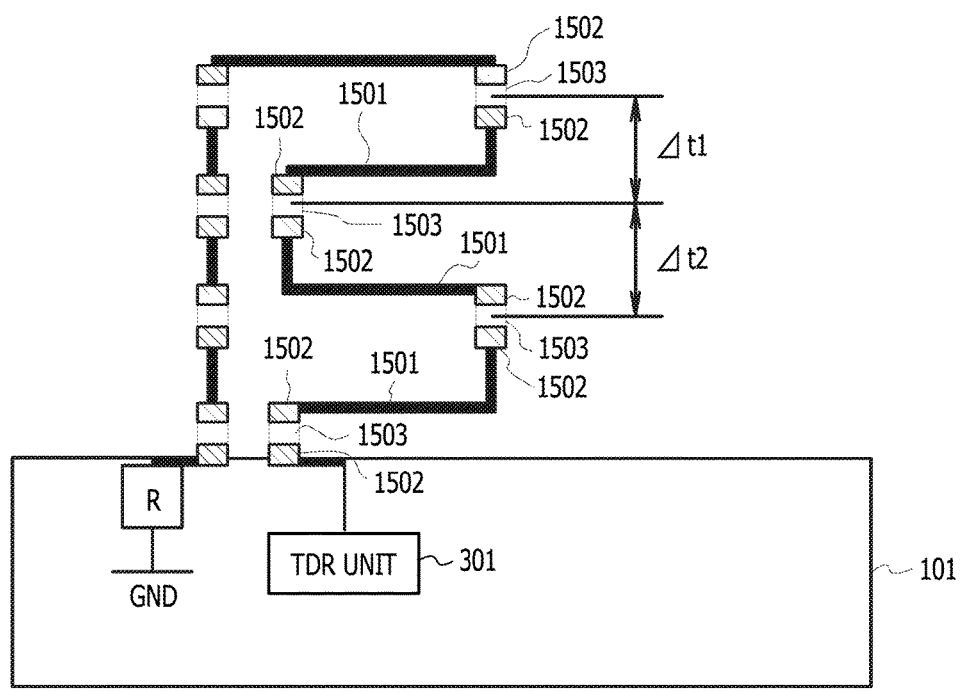
FIG. 16 is a view illustrating a configuration example of a stacked memory device in the fourth embodiment.

As illustrated in FIG. 16, one end of the transmission path that is used for TDR measurement is coupled to the TDR unit 301 in the logic chip 101 and the other end of the transmission path is terminated by a terminal resistor. The TDR unit 301 measures change in propagation delay time or impedance in the transmission path by applying a pulse signal or a step signal to the transmission path and observing a reflected waveform that returns. Note that the functional configuration of the stacked memory device in the fourth embodiment is similar to the functional configuration of the stacked memory device in the first embodiment, which is illustrated in FIG. 4, and therefore, the description thereof will be omitted.

Figure 17:
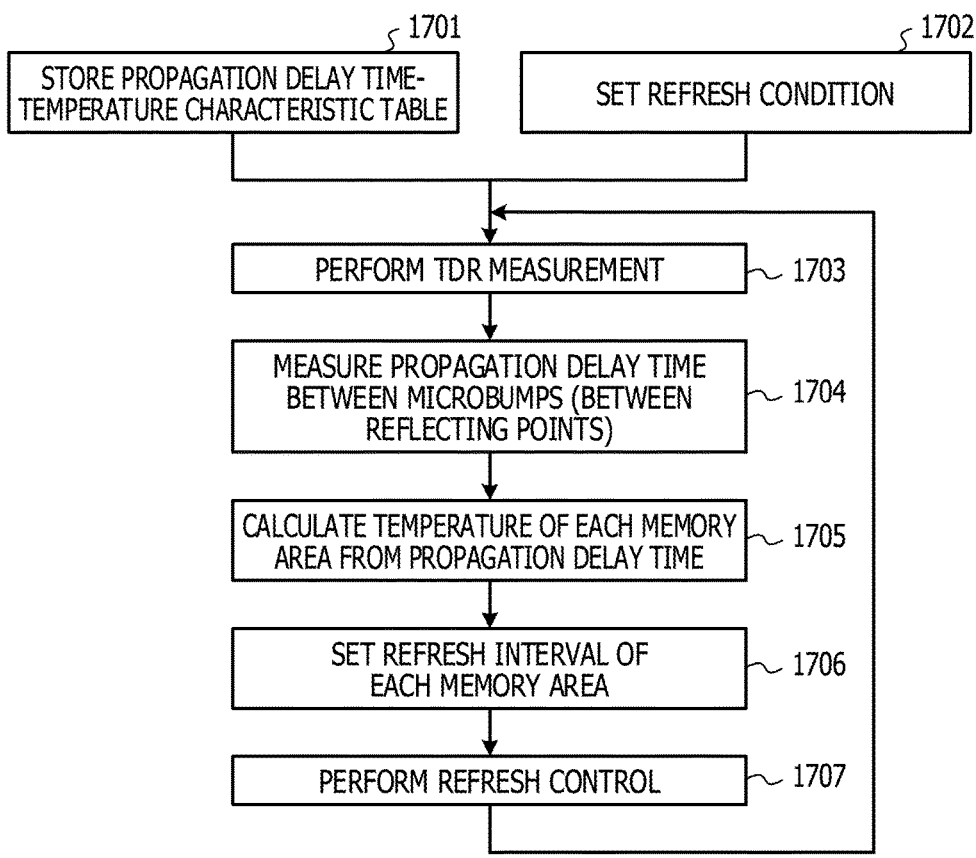
FIG. 17 is a chart illustrating an example of refresh control in a stacked memory device in the fourth embodiment.

FIG. 17 is a chart illustrating an example of refresh control in a stacked memory device in the fourth embodiment. In refresh control in the fourth embodiment, before refresh control is performed, the propagation delay time-temperature characteristic table 414A that indicates a relationship between propagation delay time of the microbump unit (1502, 1503) and temperature which have been obtained in advance is stored in the logic chip 410 (1701). In the fourth embodiment, the propagation delay time-temperature characteristic table 414A for the transmission path including TSV and an intra-memory-chip interconnect is stored. Also, a refresh condition that indicates a refresh interval relative to temperature is set in the refresh condition table 415 of the logic chip 410 (1702).

Figure 18:
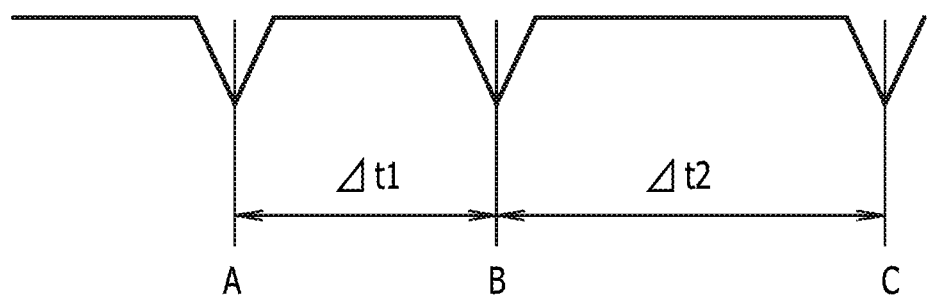
FIG. 18 is a chart illustrating an example of a reflected waveform in TDR measurement in the fourth embodiment.

When refresh control is started, the propagation delay time measurement unit 412A performs TDR measurement using a transmission path which is formed in the memory chip 420 and includes a plurality of microbump units (1502, 1503) and detects a reflected waveform (1703). Subsequently, the propagation delay time measurement unit 412A performs analysis processing on the reflected waveform that has been detected and measures propagation delay time between the microbump units (1502, 1503) (between reflecting points) (1704). For example, it is assumed that a reflected waveform that indicates a change in impedance, which is illustrated in FIG. 18, has been detected by reflection at a point A, a point B, and a point C illustrated in FIG. 16. In this case, the propagation delay time measurement unit 412A measures Δt1 as the propagation delay time of a transmission path from the point A to the point B formed with the intra-chip interconnect 1501 that is disposed so as to be close to a memory cell interposed therebetween and Δt2 as the propagation delay time of a transmission path from the point B to the point C formed with the intra-chip interconnect 1501 that is disposed so as to be close to a memory cell interposed therebetween.

Next, the temperature determination unit 413 refers to the propagation delay time-temperature characteristic table 414A and calculates temperature of each memory area from the propagation delay time that has been measured in processing 1704 (1705). Subsequently, the processor 411 refers to the refresh condition table 415 and sets a refresh interval of each memory area, based on the temperature of each memory area, which has been calculated in processing 1705 (1706). Then, the processor 411 performs control of a refresh operation for a memory in accordance with the refresh interval that has been set (1707). Thereafter, the stacked memory device regularly executes an operation of 1703 to 1707.

The stacked memory device in the fourth embodiment calculates the temperature of each memory area from the propagation delay time that has been obtained by TDR measurement using the transmission path including an interconnect disposed so as to be close to a memory cell and sets a refresh interval of each memory area, based on the temperature that has been calculated. Thus, in the stacked memory device in the fourth embodiment, a transmission path is disposed in vicinity of a memory cell, and thereby, the temperature of the memory cell is more precisely observed, so that optimization of refresh intervals may be achieved, a refresh operation may be executed for each memory area at proper refresh intervals in accordance with the temperature of the memory area, and power consumption may be reduced. Also, a wait time for waiting an access from a CPU may be reduced and performance may be increased, as compared to a case in which a uniform refresh interval is set for the entire memory, by executing a refresh operation for each memory area at proper refresh intervals in accordance with the temperature of the memory area.

Note that, although, in each of the first to fourth embodiments described above, a single TDR unit and a single transmission path that is used for TDR measurement are illustrated for explanation purposes, in consideration of an area range that is a measurement target, attenuation of a signal in a transmission path, or the like, a stacked memory device includes a proper number of TDR units and transmission paths that are used for TDR measurement. Also, not only a configuration in which a single TDR unit is included for a single transmission path but also a configuration in which a single TDR unit is included for a plurality of transmission paths may be employed.

Also, although, in each of the first to fourth embodiments described above, the processor 411 in the logic chip 410 performs control of a refresh operation for a memory in accordance with a refresh interval that has been set, control in which the processor 411 regularly issues a request for a refresh operation, the memory chip 420 selectively responds to the request in accordance with the refresh interval that has been set, and a refresh operation is executed may be performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device in which a plurality of chips each including a plurality of memory areas is stacked, the semiconductor device comprising:
    a transmission path including a plurality of microbumps formed in the plurality of chips;
    measurement circuitry that detects a reflected waveform when a signal is transmitted in the transmission path and measures propagation delay time for a certain part on the transmission path from the reflected waveform that has been detected;
    determination circuitry that calculates temperature of each memory area that corresponds to the certain part from the propagation delay time that has been measured by the measurement circuitry; and
    control circuitry that sets a refresh interval of each memory area, based on the temperature of each memory area, which has been calculated by the determination circuitry, and executes a refresh operation of a memory circuit in each memory area at the refresh interval that has been set.

2. The semiconductor device according to claim 1, wherein the measurement circuitry measures propagation delay time of the plurality of microbumps.

3. The semiconductor device according to claim 1, wherein the measurement circuitry measures propagation delay time between the plurality of microbumps that are coupled in a stacking direction of the plurality of chips via through silicon via.

4. The semiconductor device according to claim 1,
    wherein the transmission path includes an interconnect of the chip, which is disposed so as to be close to a memory cell of the memory circuit, and
    the measurement circuitry measures propagation delay time between the plurality of microbumps with the interconnect of the corresponding chip, which is disposed so as to be close to the memory cell, interposed therebetween.

5. The semiconductor device according to claim 1, wherein a high dielectric underfill is filled between the chips that are stacked.

6. The semiconductor device according to claim 1, wherein the determination circuitry refers to a table that indicates a relationship between the propagation delay time and temperature and calculates temperature of each memory area from the propagation delay time that has been measured by the measurement circuitry.

7. The semiconductor device according to claim 1, wherein the control circuitry refers to a table that indicates setting of the refresh interval relative to temperature and sets the refresh interval that corresponds to the temperature of each memory area, which has been calculated by the determination circuitry, for each of the memory areas.

8. A semiconductor device in which a plurality of chips each including a plurality of memory areas is stacked, the semiconductor device comprising:
    a transmission path including a plurality of microbumps formed in the plurality of chips;
    measurement circuitry that detects a reflected waveform when a signal is transmitted in the transmission path and measures impedance of the plurality of microbumps from the reflected waveform that has been detected;
    determination circuitry that calculates temperature of each memory area that corresponds to the plurality of microbumps from impedance that has been measured by the measurement circuitry; and
    control circuitry that sets a refresh interval of each memory area, based on the temperature of each memory area, which has been calculated by the determination circuitry, and executes a refresh operation of a memory circuit in each memory area at the refresh interval that has been set.

9. The semiconductor device according to claim 8, wherein a high dielectric underfill is filled between the chips that are stacked.

10. The semiconductor device according to claim 8, wherein the determination circuitry refers to a table that indicates a relationship between the impedance and temperature and calculates temperature of each memory area from the impedance that has been measured by the measurement circuitry.

11. The semiconductor device according to claim 8, wherein the control circuitry refers to a table that indicates setting of the refresh interval relative to temperature and sets the refresh interval that corresponds to the temperature of each memory area, which has been calculated by the determination circuitry, for each of the memory areas.

12. A control method for a semiconductor device in which a plurality of chips each including a plurality of memory areas is stacked, the control method comprising:

causing measurement circuitry of the semiconductor device to detect a reflected waveform when a signal is transmitted in a transmission path including a plurality of microbumps formed in the plurality of chips and measure propagation delay time for a certain part on the transmission path from the reflected waveform that has been detected;

causing determination circuitry of the semiconductor device to calculate temperature of each memory area that corresponds to the certain part from the propagation delay time that has been measured; and causing control circuitry of the semiconductor device to set a refresh interval of each memory area, based on the temperature of each memory area, which has been calculated, and execute a refresh operation of a memory circuit in each memory area at the refresh interval that has been set.

\* \* \* \* \*